United States Patent
Lof et al.

(10) Patent No.: US 7,375,795 B2
(45) Date of Patent: May 20, 2008

(54) LITHOGRAPHIC APPARATUS, DEVICE MANUFACTURING METHOD, AND DEVICE MANUFACTURED THEREBY

(75) Inventors: Joeri Lof, Eindhoven (NL); Jeroen Fluit, Eindhoven (NL); Bernardus Antonius Johannes Luttikhuis, Nuenen (NL); Peter Spit, Lantau Island (CN)

(73) Assignee: ASML Netherlands B.V., Veldhoven (NL)

( * ) Notice: Subject to any disclaimer, the term of this patent is extended or adjusted under 35 U.S.C. 154(b) by 89 days.

(21) Appl. No.: 11/018,930

(22) Filed: Dec. 22, 2004

(65) Prior Publication Data
US 2006/0132735 A1 Jun. 22, 2006

(51) Int. Cl.
*G03B 27/42* (2006.01)

(52) U.S. Cl. .............. 355/53; 355/67; 355/72; 356/400

(58) Field of Classification Search ......... 355/53, 355/67, 72; 356/399–401, 490–508; 378/34, 378/35
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,652,645 A * | 7/1997 | Jain | 355/53 |
| 5,677,703 A | 10/1997 | Bhuva et al. | |
| 5,710,619 A * | 1/1998 | Jain et al. | 355/50 |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,201,597 B1 * | 3/2001 | Dunn et al. | 355/53 |
| 6,211,945 B1 * | 4/2001 | Baxter et al. | 355/53 |
| 6,525,804 B1 * | 2/2003 | Tanaka | 355/53 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |

(Continued)

FOREIGN PATENT DOCUMENTS

JP 10171125 * 6/1998

(Continued)

*Primary Examiner*—D. Rutledge
(74) *Attorney, Agent, or Firm*—Sterne, Kessler, Goldstein & Fox P.L.L.C.

(57) ABSTRACT

Substrate processing apparatus includes a lithographic apparatus which comprises an illumination system for supplying a projection beam of radiation, an array of individually controllable elements serving to impart the projection beam with a pattern in its cross-section, and a projection system for projecting the patterned beam onto a target portion of a substrate. The processing apparatus also includes a substrate supply arranged to output at least one unbroken length of substrate, and a substrate conveying system arranged to convey each outputted unbroken length of substrate from the substrate supply and past the projection system such that the projection system is able to project the patterned beam onto a series of target portions along each unbroken length of substrate. In certain embodiments, long lengths of substrate are supplied from a roll, but alternatively a series of separate sheets can be supplied.

33 Claims, 4 Drawing Sheets

U.S. PATENT DOCUMENTS

| | | |
|---|---|---|
| 6,811,953 B2 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| WO | WO 98/33096 | 7/1998 |
| WO | WO 98/38597 | 9/1998 |

* cited by examiner

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to substrate processing apparatus incorporating a lithographic apparatus and a device manufacturing method.

2. Related Art

A lithographic apparatus is a machine that applies a desired pattern onto a target portion of a substrate (e.g., a workpiece, an object, a display, etc.). The lithographic apparatus can be used, for example, in the manufacture of integrated circuits (ICs), flat panel displays, and other devices involving fine structures. In a conventional lithographic apparatus, a patterning means, that is alternatively referred to as a mask or a reticle, can be used to generate a circuit pattern corresponding to an individual layer of the IC (or other device), and this pattern can be imaged onto a target portion (e.g., comprising part of a die, one die, or several dies) on a substrate (e.g., a silicon wafer or glass plate) that has a layer of radiation-sensitive material (e.g., resist). Instead of a mask, the patterning means can comprise an array of individually controllable elements that generate the circuit pattern. Lithographic systems utilizing such arrays are generally described as maskless systems.

In general, a single substrate will contain a network of adjacent target portions that are successively exposed. Known lithographic apparatus include steppers, in that each target portion is irradiated by exposing an entire pattern onto the target portion in one go, and scanners, in that each target portion is irradiated by scanning the pattern through the beam in a given direction (the "scanning" direction), while synchronously scanning the substrate parallel or anti-parallel to this direction.

It is known to batch process substrates, in the production of a wide variety of devices. For example, in the manufacture of flat panel displays (FPDs) it is known to use a mask-based exposure tool (i.e., a lithographic tool incorporating a fixed, non-programmable patterning device), and to carry out the exposure on a single substrate. Typically, a number of exposure steps are required, along with additional pre- and post-exposure processing steps to build up the FPD device structure, each step being carried out by a respective and separate processing tool. In each tool, the substrate is supported by a respective support stage, and batch processing has necessitated numerous handling steps, delivering the substrate to the series of support stages, collecting the substrate from each support stage after the respective processing step is complete, and transporting the substrate between the separate tools. This has meant that only approximately 65% of the Turn Around Cycle Time (TACT) for processing a substrate has been "useful" exposure time, the rest being time spent on transport, handling, and metrology. The use of separate tools and the need for complex handling systems for loading, unloading, and inter-tool transport have also required large fabrication facilities.

Therefore, what is needed is a system and method that obviate or mitigate the problems outlined above.

SUMMARY

According to an embodiment, there is provided a substrate processing apparatus comprising a lithographic apparatus including an illumination system for supplying a projection beam of radiation, an array of individually controllable elements serving to impart the projection beam with a pattern in its cross-section, and a projection system for projecting the patterned beam onto a target portion of a substrate. The substrate processing apparatus can further include a substrate supply arranged to output at least one unbroken (i.e., continuous, uninterrupted) length of substrate and a substrate conveying system arranged to convey the, or each, outputted unbroken length of substrate from the substrate supply and past the projection system such that the projection system is able to project the patterned beam onto a series of target portions along the, or each, unbroken length of substrate.

It will be appreciated that the, or each, unbroken length of substrate can also be described as a "continuous length," an "uninterrupted length," or an "individual length," and throughout the remainder of this specification such terms should be interpreted accordingly.

According to a further embodiment, the substrate conveying system is arranged to convey the, or each, outputted unbroken length of substrate continuously from the substrate supply and past the projection system (i.e., it conveys each individual length in an uninterrupted manner from the supply past the projection system). In other words, it can be arranged to move the length(s) progressively, without interruption, past the projection system, thereby providing a smooth and continuous feed. The conveying system transports the, or each, length along a linear path.

In certain embodiments, a continuous length of substrate is provided from a roll, i.e. the substrate supply initially includes (e.g., holds or stores) a roll of substrate, that roll comprising the continuous length. The substrate supply is then arranged to output the continuous length from the roll. To be provided on a roll, the substrate material should be sufficiently flexible, for example to be wound around a supply reel without degradation. In certain embodiments, the rolled substrate can be formed from material that is usually thought of as inflexible, such as glass/silicon, provided the material is in the form of a sufficiently thin sheet or band or ribbon. For example, in some embodiments, the supply includes a reel on which a glass substrate of thickness 105 micrometers is wound, the minimum winding radius being 30 mm.

By supplying substrate continuously from a roll, a greater throughput can be achieved compared with batch processing. The exposed substrate can be collected on another reel (a take-up reel) for transport to other processing stages, or alternatively a number of stages can be arranged in series to give comprehensive in-line processing. This enables the area required for the fabrication system as a whole to be greatly reduced, in addition to improving production rate and reducing the substrate area tied up as work in progress. Embodiments of the invention can thus provide roll to roll "printing" (i.e., patterning). The substrates in certain examples can be rolls of plastic (e.g., organic sheets) or glass, and can be supplied continuously via an appropriate feed-through arrangement, to and through the lithographic stage or stages.

Where used, the roll of substrate can include a layer of separating material arranged between adjacent layers of substrate. In such examples, the apparatus can further include a separating system for separating the layer of separating material from the outputted substrate before the outputted substrate is conveyed past the projection system.

Very long continuous (i.e., uninterrupted) lengths of substrate can be processed compared to the previous batch processing systems. For example, an outputted continuous length of substrate can have a substantially uniform width, and a length at least five times as large as that width. In other embodiments, the length:width ratio can be even greater, for example 10:1, 20:1, 40:1 or more. However, smaller length:width ratios are also possible. For example, rather than the substrate supply outputting substrate from a roll, in certain embodiments it can initially hold a plurality of separate, flat substrate sheets (e.g., in a stack, or some other arrangement). Although these individual sheets can be long, in certain embodiments each sheet can have a length:width ratio of 1:1 or even less. With such supplies, the conveying means can be arranged to supply the separate substrate lengths to the lithography apparatus in a steady (regular) stream or series. The gaps or intervals between successive sheets in the series can be kept as small as possible in order to maximize throughput. For example, the gaps can be less than 10%, 5%, or 2% of the substrate length, or even smaller. Substrates of any length can be processed with apparatus and methods embodying the invention. Particular embodiments are able to process substrates of length 2000 mm and longer. Thus, the substrate supply can be arranged to output a plurality of individual unbroken lengths of substrate, and the substrate conveying system can be arranged to convey the plurality of outputted unbroken lengths of substrate from the substrate supply and past the projection system in a series. The series can be substantially continuous.

In embodiments, the lithographic apparatus further includes a detection system arranged to detect alignment marks on the continuous length, or lengths, of substrate. The detection system can be arranged to detect at least two rows of alignment marks extending along the continuous length of substrate. In certain examples, the detection system is arranged to output a detection signal in response to detecting the alignment marks, the lithographic apparatus further comprising a controller arranged to provide a control signal to the array of controllable elements, the controller being arranged to receive the detection signal and to determine the control signal according to the detection signal (e.g., the controller can adjust or adapt the control signal according to the detection signal). By appropriate arrangement of a detection system and the alignment marks, the apparatus can thus detect distortions such as thermal expansions and contractions of the substrate surface as the substrate is moving along, and then adjust the control of the array (or arrays) of controllable elements accordingly so that the projected pattern is correctly in register with the substrate surface. The system can thus adapt to factors which would otherwise have led to errors in the positioning of the projected beam pattern, and furthermore can perform these corrections without having to interrupt the motion (feed) of substrates through the lithographic apparatus.

The detection system can be arranged to output a detection signal in response to detecting the alignment marks, the apparatus further comprising a controller arranged to receive the detection signal and to control the substrate conveying system according to the detection signal. The controller can be arranged to control the substrate conveying system to adjust a speed at which the continuous length of substrate is conveyed past the projection system according to the detection signal.

In embodiments, the apparatus further includes a control system arranged to control the lithographic apparatus and the substrate conveying system such that the patterned beam is projected onto the continuous length of substrate while said length is moving past the projection system.

It can further include a substrate support arranged to support at least a portion of the substrate being exposed to the patterned beam from the projection system.

The substrate conveying system can include at least one roller arranged to engage a surface of the continuous length(s) of substrate, and a drive system arranged to rotate the roller.

The apparatus can further include a reel arranged to take up the continuous length(s) of substrate after the length has been conveyed past the projection system.

In embodiments, the apparatus further includes at least one additional substrate processing stage arranged in series with the lithographic apparatus to perform additional processing on the continuous length of substrate, the conveying system being arranged to convey said length continuously from the substrate supply and through the at least one additional stage and past the projection system. The additional substrate processing stage can include a substrate conditioning stage arranged to condition the substrate before the lithographic apparatus. Alternatively, it can include a marking stage arranged to apply a pattern of alignment marks to the substrate before the lithographic apparatus.

Examples of additional processing stages are a "track" arranged to apply resist to the substrate (before the projection system) and/or to develop exposed resist (after the projection system), a process step (or modification step) in which permanent modification of the substrate takes place (i.e., the modification step uses the mask that is created by the projection of the patterned beam onto the resist), and a step in which resist is stripped from the substrate after the "modification" step to leave the substrate "clean," with one extra device layer on it.

Certain embodiments include a multitude of processing steps, including more than one exposure step, which collectively process the substrate from a bare (i.e., empty) state to a "complete," half-product state, for example, which can be cut into pieces for assembly in displays etc. Multi-process embodiments can also produce lengths of processed substrate which can be cut and used as flexible substrates as carriers for other devices, etc.

According to a further embodiment, there is provided a device manufacturing method comprising the steps of providing a substrate supply, outputting from the supply at least one unbroken (continuous) length of substrate, providing a projection beam of radiation using an illumination system, using an array of individually controllable elements to impart the projection beam with a pattern in its cross-section, providing a projection system to project the patterned beam, conveying the, or each, outputted unbroken length of substrate (e.g., continuously) from the substrate supply and past the projection system, and projecting the patterned beam of radiation onto a series of target portions along the, or each, unbroken length of substrate.

In certain embodiments, the step of providing a substrate supply includes providing a continuous length of substrate on a roll. Again, the substrate can be glass, for example when the device being produced is an FPD.

The method can further include the step of collecting the length(s) of substrate on a roll after exposure to the patterned beam.

Alternatively, the supply and conveying means can be arranged to supply (feed) a continuous stream of substrates (which can have lengths different from, or the same as, their widths) past the lithography apparatus. Thus, rather than very long substrates, certain embodiments can provide a "continuous" substrate supply in the form of a series of substrates of more limited length.

Additionally, or alternatively, the method can further include the steps of processing the, or each, length of substrate in at least one additional processing stage, and conveying the outputted length(s) of substrate continuously (i.e., without interruption or stopping, and without requiring transfer from one handling device to another) from the substrate supply, through the additional processing stage or stages, and past the projection system. The additional stages can be arranged before and/or after the projection system (i.e., they can be arranged in series before and/or after the lithography stage).

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

Figure 5:
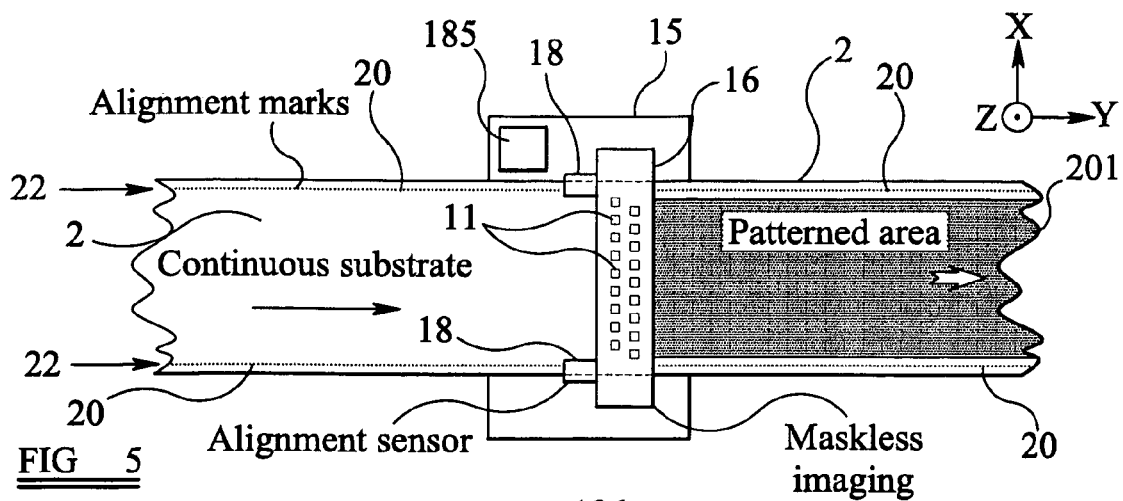
Figure 6:
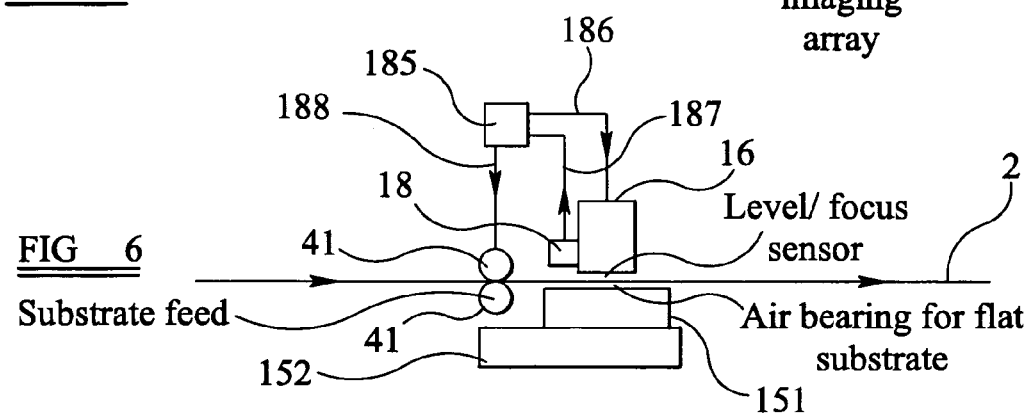

FIGS. 5 and 6 respectively depict plan and side views of part of a substrate processing apparatus embodying the invention.

Figure 7:
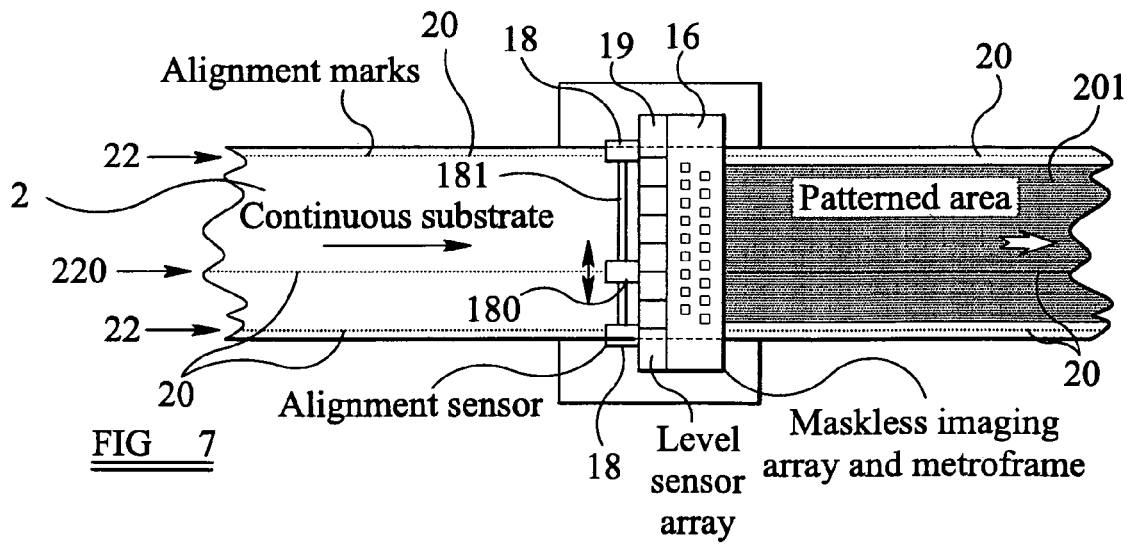
Figure 8:
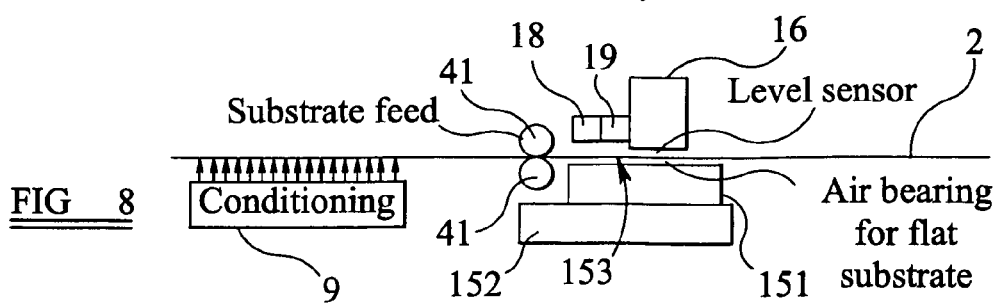

FIGS. 7 and 8 respectively depict plan and side views of yet another substrate processing apparatus embodying the invention.

Figure 9:
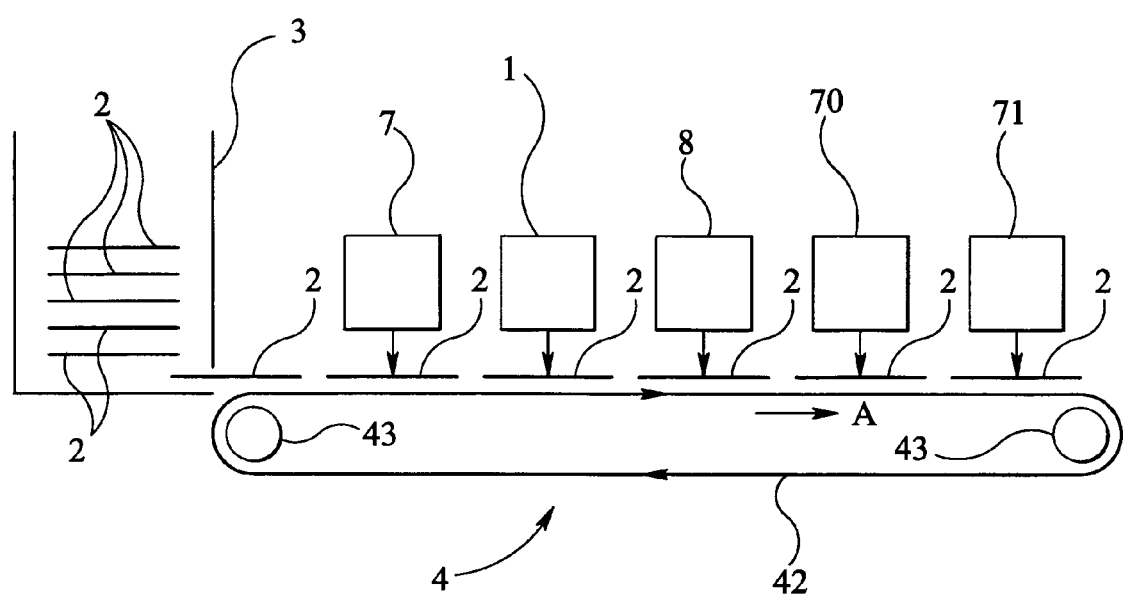

FIG. 9 depicts another substrate processing apparatus embodying the invention.

The present invention will now be described with reference to the accompanying drawings. In the drawings, like reference numbers can indicate identical or functionally similar elements.

DETAILED DESCRIPTION

Overview and Terminology

Although specific reference can be made in this text to the use of lithographic apparatus in the manufacture of integrated circuits (ICs), it should be understood that the lithographic apparatus described herein can have other applications, such as, for example, the manufacture of DNA chips, micro-electromechanical systems (MEMS), micro-optical-electromechanical systems (MOEMS), integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the filter can filter out the diffracted light, leaving the undiffracted light to reach the substrate. In this manner, the beam becomes patterned according to the addressing pattern of the matrix addressable surface. It will be appreciated that, as an alternative, the undiffracted light can be filtered out of the reflected beam, leaving the diffracted light to reach the substrate. An array of diffractive optical micro-electricalmechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors that can each be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors. In this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays.

More information on mirror arrays as here referred to can be gleaned, for example, from U.S. Pat. Nos. 5,296,891 and 5,523,193, and PCT patent applications WO 98/38597 and WO 98/33096, that are incorporated herein by reference in their entireties. A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the programmable mask (i.e., the array of controllable elements) and the first element of the projection system and/or between the first element of the projection system and the substrate. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Apparatus

Figure 1:
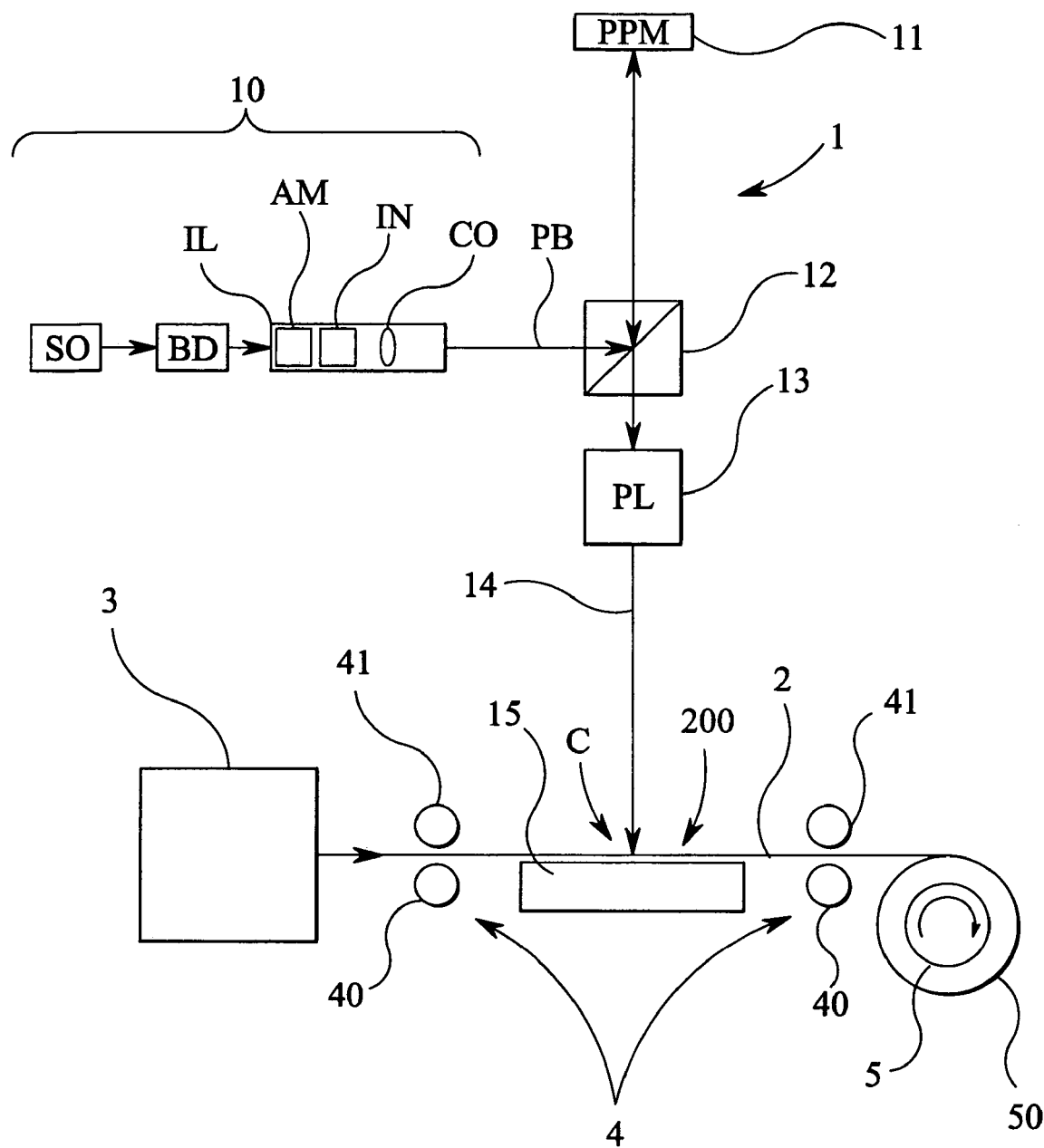
FIG. 1 depicts substrate processing apparatus incorporating lithographic apparatus and in accordance with an embodiment of the invention.

FIG. 1 schematically depicts a substrate processing apparatus according to a particular embodiment of the invention. The apparatus includes lithographic projection apparatus 1 that includes an illumination system (illuminator) IL for providing a projection beam PB of radiation (e.g., UV radiation). Lithographic projection apparatus 1 also includes an array of individually controllable elements 11 (PPM) (e.g., a programmable mirror array) for applying a pattern to the projection beam. In general, the position of the array of individually controllable elements will be fixed relative to item 13 (PL), however it can instead be connected to a positioning means for accurately positioning it with respect to item 13 (PL). Lithographic projection apparatus 1 also includes a substrate table 15 for supporting a substrate 2 (e.g., a resist-coated film, sheet, band, or web) and a projection system ("lens") 13 (PL) for imaging a pattern imparted to the projection beam PB by the array of individually controllable elements 11 (PPM) onto a target portion C (e.g., comprising one or more dies) of the substrate 2. The projection system 13 can image the array of individually controllable elements 11 onto the substrate. Alternatively, the projection system 13 can image secondary sources for which the elements of the array of individually controllable elements act as shutters. The projection system can also comprise a micro lens array (known as an MLA), e.g. to form the secondary sources and to image microspots onto the substrate.

As here depicted, the apparatus is of a reflective type (i.e., has a reflective array of individually controllable elements). However, in general, it can also be of a transmissive type, for example (i.e., with a transmissive array of individually controllable elements).

The illuminator IL receives a beam of radiation from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source can be an integral part of the apparatus, for example when the source is a mercury lamp. The source SO and the illuminator IL, together with the beam delivery system BD if required, can be referred to as a radiation system.

The illuminator IL can comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The beam PB subsequently intercepts the array of individually controllable elements 11 (PPM). (It will be appreciated that in addition to the beam being conditioned, in certain embodiments it can be divided into an array (matrix) of beams corresponding to the individual elements of the programmable mask 11 (PPM)). Having been reflected by the array of individually controllable elements 11 (PPM), the beam PB passes through the projection system 13 (PL), which focuses the beam PB onto a target portion C of the substrate 2. With the aid of a substrate conveying system 4 the substrate 2 can be moved accurately, e.g. so as to position different target portions C in the path of the beam PB. Where used, a positioning means for the array of individually controllable elements can be used to accurately correct the position of the array of individually controllable elements 11 (PPM) with respect to the path of the beam PB, e.g. during a scan. Movement of the array of individually controllable elements 11 (PPM) can, for example, be realized with the aid of a long-stroke module (course positioning) and a short-stroke module (fine positioning), which are not explicitly depicted in FIG. 1. It will be appreciated that the projection beam can alternatively, or additionally, be moveable while the array of individually controllable elements 11 (PPM) can have a fixed position to provide the required relative movement. As a further alternative, the position of the substrate table and the projection system can be fixed. In the illustrated example, the substrate is arranged to be moved relative to the substrate table. For example, the substrate conveying system 4 can be arranged to scan the substrate across the table/support 15 at a substantially constant velocity.

Although the lithography apparatus in the processing apparatus according to the invention is herein described as being for exposing a resist on a substrate, it will be appreciated that the invention is not limited to this use and the lithographic apparatus can be used to project a patterned projection beam for use in resistless lithography.

The depicted apparatus can be used in five modes:

1. Step mode: the array of individually controllable elements imparts an entire pattern to the projection beam, which is projected onto a target portion C in one go (i.e., a single static exposure). The substrate 2 is then shifted in the Y direction so that a different target portion C can be exposed. In step mode, the maximum size of the exposure field limits the size of the target portion C imaged in a single static exposure.

2. Scan mode: the array of individually controllable elements 11 (PPM) is movable in a given direction (the so-called "scan direction," e.g., the Y direction) with a speed v, so that the projection beam PB is caused to scan over the array of individually controllable elements 11 (PPM). Concurrently, the substrate 2 is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements 11 (PPM) is kept essentially stationary and the entire pattern is projected onto a target portion C of the substrate using a pulsed radiation source. The substrate 2 is moved with an essentially constant speed such that the projection beam PB is caused to scan a line along the substrate 2. The pattern on the array of individually controllable elements 11 (PPM) is updated as required between pulses of the radiation system and the pulses are timed such that successive target portions C are exposed at the required locations on the substrate.

4. Continuous scan mode: essentially the same as pulse mode except that a substantially constant radiation source is used and the pattern on the array of individually controllable elements 11 (PPM) is updated as the projection beam scans along the substrate and exposes it.

5. Pixel Grid Imaging Mode: the pattern formed on substrate 2 is realized by subsequent exposure of spots that are directed onto array 11 (PPM). The exposed spots have substantially a same shape. On substrate 2 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

The substrate processing apparatus depicted in FIG. 1 thus includes lithographic apparatus 1 comprising an illuminator system 10 arranged to supply a projection beam PB of radiation. The projection beam PB is directed via a beam splitter 12 to an array of individually controllable elements 11 which are programmable to impart the projection beam with a desired pattern in its cross section. The patterned beam from the programmable patterning device 11 is then directed, again via the beam of the splitter 12 in this example, to a projection system 13 which projects the patterned beam 14 onto the target surface 200 of a substrate 2. In this example the apparatus also comprises a substrate supply 3, positioned with respect to the projection system 13, and arranged to output the substrate 2 in a form of continuous (i.e., uninterrupted) length. The substrate in this example is in the form of a flexible sheet, which can also be described as a band, ribbon, tape or web. The substrate supply 3 can comprise a roll of flexible substrate, for example. Thus, the substrate supply can contain a stock of pre-manufactured substrate for delivery to the lithographic apparatus. In other embodiments, rather than containing a supply of pre-manufactured substrate, the substrate supply can itself be arranged to manufacture and output the substrate in an appropriate form.

The substrate processing apparatus also comprises a substrate conveying system 4 arranged to convey the outputted substrate 2 continuously from the substrate supply 3 and past the projection system 13 so that the projection system 13 is able to project the patterned beam 14 onto a series of target portions along the substrate 2. In this example, the substrate conveying system 4 comprises a plurality of passive support rollers 40 arranged underneath the substrate 2 and a plurality of drive rollers 41 arranged to engage an upper surface of the substrate 2 and drive it in a direction indicated by an arrow in the figure. The portion of the substrate surface being exposed to the patterned beam 14 from the projection system 13 is supported by a substrate support 15 which can take a variety of forms. For example, it can comprise a rigid, fixed upper support surface with which the target portion of the substrate 2 is in direct contact. Also, it can comprise at least one moveable or deformable member to enable support of the substrate 2 to be adjusted to control the topography of the target surface so that the patterned beam is correctly focussed over its full extent. Additionally, or alternatively, the support 15 can include means for providing a fluid (e.g., gas) cushion to support the substrate 2 as it is being exposed (i.e., patterned).

In this example, the processing apparatus also comprises a take-up spool 5 which is rotated to collect substrate 2 processed by the lithographic apparatus 1. Thus, the depicted apparatus produces a roll 50 of patterned substrate which can be transported and then used to supply the patterned substrate to another substrate processing stage, for example to a developer stage for developing photosensitive material on the substrate that has been exposed to the patterned beam.

Although FIG. 1 shows a conveying system comprising driven and passive rollers, it will be appreciated that this is only an example, and that many other forms of conveying systems (i.e., substrate transport mechanisms) can be used. For example, the conveying system can comprise a vacuum transport belt, or means for mechanical clamping on a bottom side of the substrate 2. Other mechanisms will be apparent to those skilled in the art.

Although FIG. 1 shows a single programmable patterning device 11, it will be appreciated that the lithographic apparatus can comprise a number of such patterning devices, each providing a respective patterned beam for projection onto the target surface of the substrate 2 by a respective projection system 13. Each patterning device 11 and its associated projection system 13 can be described as an optical engine, and the engines can be arranged so that they collectively expose an area of the substrate 2 which extends across its width.

Figure 2:
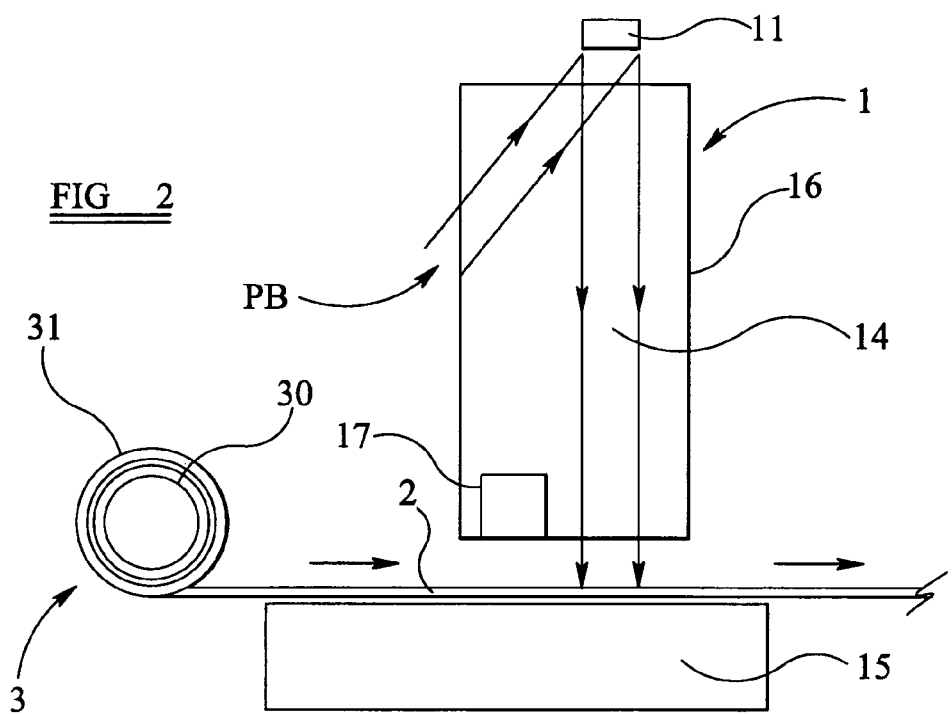
FIG. 2 depicts substrate processing apparatus in accordance with another embodiment.

Referring now to FIG. 2, the substrate supply 3 comprises a long length of substrate film in the form of a roll 31. In this example, the roll 31 has been wound on a supply reel 30. A substrate conveying system (not shown in the figure), which can also be described as a continuous substrate transport system, is arranged to extract substrate film from the roll 31 and feed the substrate 2 through a lithography stage. This involves feeding the substrate past lithographic apparatus 1 that is arranged to direct a patterned beam 14 of radiation onto the surface of the moving substrate 2. The pattern on the beam is controlled by controlling a programmable beam patterning device 11 supported by a frame 16. The programmable device 11 can also be referred to as a programmable contrast device. The patterned beam of 14 is the exposure light delivered to the substrate surface. The frame 16 of the lithographic apparatus 1 also carries a sensor system 17 arranged to detect alignment marks and/or the topography of the surface of the substrate 2 passing beneath it. Suitable control means (not shown in the figure) is arranged to receive a signal or signals from the sensor system 17 and to control the patterning device 11 accordingly. The lithographic apparatus 1 in this example also comprises a fixed guiding bed 15 for supporting the substrate 2. This guiding bed 15 can, for example, provide an air cushion on which the continuous substrate 2 floats as it passes over the bed 15, and can also incorporate a vacuum pre-tension system. In such a system, an airflow is provided over a guiding surface, but there are also provided some vacuum areas which are therefore able to provide a load on a substrate otherwise supported by the air bearing. This load acts towards the guiding surface, and the system is thus able to provide stable control of the substrate in the nominal Z direction (i.e., normal to the guiding surface). It will be appreciated that, compared with previous batch processing systems in which substrate were handled and exposed separately, the apparatus depicted schematically in FIG. 2 provides the advantage that the exposure tool (i.e., lithographic apparatus 1) can have a significantly smaller footprint, and can have a lower cost as no substrate stage and no loader/unloader is required. By supplying substrate to the exposure tool in the form of a substrate film from a roll, higher rates of substrate processing (in terms of $m^2/s$) can be achieved compared with batch processing. In the embodiment shown in FIG. 2, the apparatus comprises a maskless lithographic system and substrate 2 can be fed through the lithographic apparatus 1 in a single direction of transport, with no reverse or step in the motion. The lithographic apparatus 1, by appropriate control of the patterning device 11, is able to provide continuous exposing of film substrates. It will be appreciated that several production machines can be connected with respect to each other to provide an overall in-line process. Alternatively, a substrate roll can be processed in a machine and then rolled up and transported to another production tool/machine/stage.

General advantages provided by embodiments of the invention are that much higher exposure throughputs are achievable, there can be an enormous decrease in the amount of work in process in a fabrication plant (i.e., the amount of substrate area at any one time that is being stored in some way, awaiting subsequent processing steps), and it enables significantly smaller clean rooms/fabrication areas to be used.

As mentioned above, in embodiments of the invention the substrate can be supplied on a roll. For certain applications, the substrate can be glass (for example, for use in the manufacture of flat panel displays). It will be appreciated that the ability to supply such substrate material on a roll is dependent upon the thickness of the substrate. For example, for some applications, the substrate can be glass with a thickness of 0.1 mm or less. Glass with a thickness of 0.1 mm can be produced having a minimum bending radius of 30 mm at present. Thus, the size of any spool on which the continuous length of substrate is wound is selected to suit the bending characteristics of the substrate material.

Figure 3:
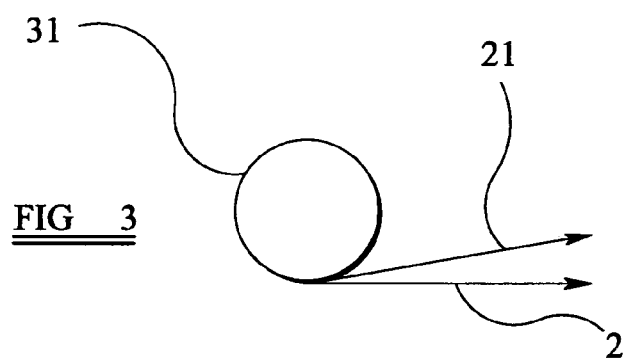
FIG. 3 depicts a substrate roll suitable for use in embodiments of the invention.

FIG. 3 depicts, in highly schematic form, a substrate roll 31 suitable for use in embodiments of the invention. In that roll, the substrate 2 has been co-wound with a length of separating material (i.e., a spacer 21). This material can, for example, be suitable foil. Thus, subsequent layers (or turns) of the substrate 2 are not in direct contact with each other; they are separated by the spacer 21. Typically, when the substrate roll 31 is arranged in a substrate processing system, the separating layer 21 is removed from (i.e., separated from) the substrate 2 before the substrate 2 is fed through the one or more processing stages (e.g., a lithographic exposure stage).

Figure 4:
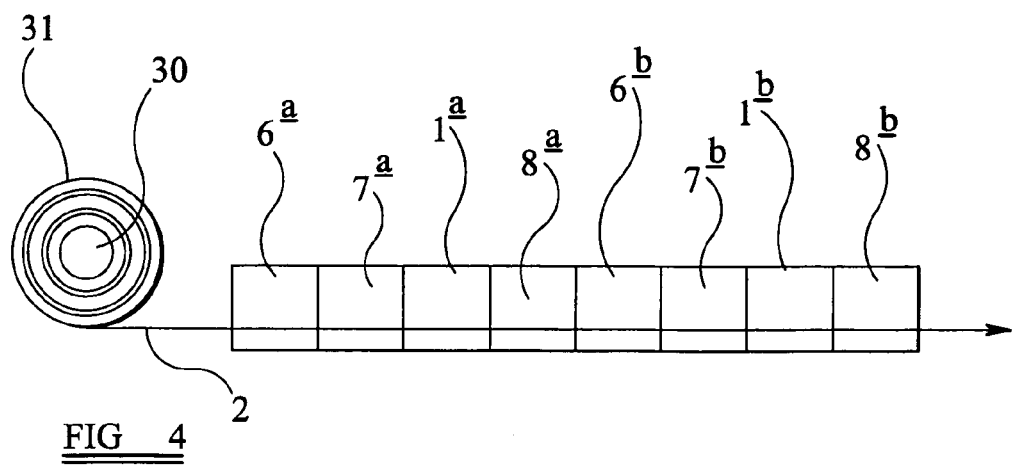
FIG. 4 depicts a substrate processing system in accordance with yet another embodiment of the invention.

Moving on to FIG. 4, this depicts an in-line substrate processing system embodying the invention and suitable for processing substrates in the manufacture of flat panel display (FPD) devices (of the LCD and other types). In this embodiment, a continuous length of substrate 2 is initially supplied on a roll 31. A plurality of processing stages 6*a*, 7*a*, 1*a*, 8*a*, 6*b*, 7*b*, 1*b*, 8*b* are arranged in-line (i.e., in series, and connected with respect to each other). A substrate conveying system (the details of which are not shown in the figure) is arranged to convey substrate 2 from the reel 31 through the various processing stages in turn. It will be appreciated that each processing stage can also be referred to as a processing system, a processing apparatus, or equivalently a substrate processing tool. In this example, the processing stages 6*a* and 6*b* are first and second deposition stages (i.e., they perform deposition processing steps), processing stages 7*a* and 7*b* are first and second coaters, stages 1*a* and 1*b* are first and second lithography stages (incorporating programmable beam patterning devices) and stages 8*a* and 8*b* are first and second developer stages. The deposition stages 6*a* and 6*b* deposit material layers on the substrate 2, and can utilize one or more of a variety of techniques, such as chemical vapor deposition (CVD), plasma-enhanced chemical vapor deposition (PECVD), electroplating, and other techniques known in the art. By arranging the different stages of the substrate processing equipment in-line, the footprint of the overall system is dramatically reduced compared with a batch processing system, the amount of work in progress is reduced, and the substrate processing rate can also be greatly increased with respect to batch processing systems. In certain embodiments, the substrate conveying system is arranged to provide continuous (i.e., uninterrupted) motion of the substrate through the lithographic (i.e., patterning) tools.

Although the above system has been described as incorporating coaters, lithographic apparatus and developers, it will be appreciated that these are merely examples and that processing stages performing other functions can be incorporated in the apparatus in addition to one or more lithography tools.

Also, although the substrate 2 is shown as being supplied directly from one processing tool to the next in the series in this example, in alternative embodiments it is possible that after one processing stage the substrate is wound onto a roll, and that roll is then transported within the fabrication plant to one or more subsequent processing tools.

Referring now to FIGS. 5 and 6, in another embodiment of the invention a continuous substrate 2 is conveyed through a lithographic apparatus by a suitably arranged conveying system. In the lithographic apparatus, the substrate 2 is supported by a stationary support table 15 comprising a base 152 and a support member 151 on which the substrate is supported on an air bearing. The substrate conveying system includes driven rollers 41 which are rotated at a controlled speed, and engage the substrate so as to controllably urge it forward in a direction shown by the large arrows in FIG. 5. The support table 15 is stationary in a sense that it does not move in either the X or Y directions relative to the frame 16 of the lithographic apparatus 1. By driving the rollers 41, the conveying system is arranged to convey the substrate 2 over the support table 15.

The upper surface of the substrate 2 has been provided with a pattern of alignment marks 20, the pattern being distributed over the length of the substrate 2. In this example, the alignment marks 20 are small spots or dots. The pattern comprises first and second rows 22 of alignment marks 20 extending along each side of the substrate surface. These rows 22 are parallel to each other and are arranged outside and on either side of an area 201 of the substrate 2 that is patterned by the lithographic apparatus. The frame 16 is arranged above the portion of the substrate 2 being supported on an air bearing by the table 15. This frame 16 supports an array of optical engines, that array extending across a substantial portion of the substrate width. Each engine comprises a respective beam patterning device comprising a respective array of individually controllable elements. The array of optical engines thus delivers a patterned dose of radiation to an area of the substrate 2 extending across its width. As the patterned dose is formed from a plurality of "images" (each image from a respective programmable mask and projection optics), accurate stitching between the images is required. The lithographic apparatus also includes a detection system for detecting the rows of alignment marks. In this example, the detection system comprises two alignment sensors 18 which are microscope cameras attached to the frame 16 in front of and on either side of the area of the substrate 2 being exposed to the patterned beam. These microscope cameras 18 are each arranged to detect the individual alignment marks 20, and hence are arranged to monitor the rows of alignment marks on either side of the substrate 2. The microscope cameras 18 detect reflected light from the substrate at positions in front of the target portion. It will be appreciated that by appropriately marking the substrate 2 and by monitoring the two rows 22 of a line of marks, the detection system is able to provide an indication of the movement of the substrate 2 in the Y direction in the figure. If the detection system is suitably arranged, as it is in certain embodiments, then the two lines 22 can also be monitored to provide an indication of any displacements of the substrate 2 in the perpendicular, X direction. To ensure that the radiation pattern is projected onto the correct portion of the substrate 2 (either in a first exposure step or in a subsequent exposure step to overlay a pattern on a previously produced pattern on the substrate) a signal 187 from the detection system is provided to a controller 185. The signal 187 is indicative of the position and/or the movement of the substrate 2 relative to the protection system frame 16. The controller 185 in this example controls both the programmable beam patterning devices 11 (by means of a suitable control signal or signals 186) and also the speed at which the substrate 2 is fed past the projection system (by means of a control signal 188 applied to the drive mechanism for the rollers 41). Thus, according to the detected position/movement of the substrate, the controller 185 can adjust the feed speed and/or the pattern or patterns applied to the projection beam(s). For example, if the detection system 18 provides an indication that a shift in the X direction has occurred, the controller 185 can be used to adjust the control signals to the controllable elements in the beam patterning and projection system so as to provide a corresponding shift to the projected pattern. Thus, even though a shift in X has occurred, the pattern is delivered to the correct part of the substrate 2. Additionally, or alternatively, the signal 187 from a detection system can be used to adjust the timing of control data sent to the controllable elements, so that the radiation pattern being projected onto the substrate 2 at a particular time is appropriate to the current position of the substrate 2 in the Y direction. It will be appreciated that a detection system can also be used to detection rotations of the substrate 2 in the Z direction and the substrate conveying system can be arranged so that it is controllable to correct for this rotation. Alternatively, or additionally, the beam patterning can be adjusted to compensate for this rotation.

It will be appreciated that the apparatus shown in FIGS. 5 and 6 can be used in substrate processing techniques for FPD applications, for example, and very long substrate lengths can be patterned with resolutions on the order of 1 micron or even smaller, if the patterning devices and associated projection systems are appropriately arranged. The lithographic apparatus shown in FIGS. 5 and 6 can thus be described as a maskless patterning system which can be incorporated in an overall substrate processing system to enable continuous production of fully, or partially, processed substrates for a device such as a flat panel display.

In certain embodiments, the substrate processing apparatus can be used in the production of flexible displays (e.g., organic light-emitting diodes (OLEDs)). A long, continuous sheet of flexible substrate can thus be processed through a production line that consists of one or more processing systems. For example, a substrate processing system embodying the invention can comprise a combination of coating, imaging and development stages, and even a complete production line with all process steps necessary for the production of an FPD or other device. Substrate processing lines embodying the invention can include steps associated with the production of the substrate, the addition of special layers or coatings onto the substrate, one or more patterning steps, and processed steps that use the patterned mask, such as etching, and implantation, etc. The production line can also comprise steps such as the cutting of the previously continuous substrate into individual device sections, and packaging.

It will also be appreciated that the substrate processing apparatus and methods embodying the invention are not limited to the production or manufacture of flexible displays, but can be used with any device that is built on a "flexible" substrate, i.e., one which can be wound onto a spool of the appropriate diameter without degradation. The substrate can thus be formed from material that is usually considered to be non-flexible, such as glass, provided it is in the appropriate form (in the case of glass, for example, if it is in a thin enough sheet). Substrate processing methods and apparatus embodying the invention provide a faster and cheaper production method than the previous batch processing methods, and find particular application for the mass production of flexible displays and other large area devices whose production involves lithographic techniques.

Referring back to FIGS. 5 and 6, in this example the lithographic apparatus also includes a level and focus sensor. An output from that sensor can be used to control the substrate support and/or one or more components of the beam patterning and projection system so that the projected radiation pattern is correctly focused on the substrate surface.

Referring now to FIGS. 7 and 8, these show part of another substrate processing apparatus embodying the invention. A long substrate 2 has been provided with a pattern of alignment marks, that pattern comprising three rows of individual alignment marks 20. The rows are parallel, and two of the rows 22 are located along edge portions of the substrate 2, while the middle row 220 runs generally along a central portion of the substrate 2. A substrate conveying system is arranged to transport the continuous substrate 2 past a frame 16 which carries an array of programmable beam patterning devices 11 and their associated beam projection systems. This array of patterning devices 11 again extends across a portion of the substrate with, and is arranged to enable, patterning of the substrate across that entire portion, without gaps in between. An alignment mark detection system is arranged to monitor the rows of alignment marks 20. This detection system comprises fixed detectors 18, at fixed positions relevant to the frame 16 for monitoring the outer rows of alignment marks, and a moveable detector 180 (moveable in the nominal X direction in this example) for monitoring the middle row 220.

Also attached to the frame 16 is an array of level sensors 19 extending across the entire width of the substrate 2. These sensors 19 are contactless distance sensors (which can use optical, acoustic, or other suitable techniques). These sensors 19 measure the height of the substrate 2 in front of the imaging array. According to the substrate topography as measured by the sensors 19, the focusing of the patterned beam or beams onto the substrate can be corrected by moving a component of the beam projection systems (for example, in embodiments where the projection system comprises a micro lens array MLA, to adjust focus the MLA can be moved in the Z direction, and/or can be rotated about the X and/or Y axes). The apparatus shown in FIGS. 7 and 8 thus enables continuous patterning of substrates. A number of sensors 18, 180 (in this example a combination of both fixed and moveable sensors) are positioned in front of the imaging engine (i.e., the part of the lithographic apparatus which projects the patterned beam onto the substrate 2). These sensors 18/180 measure the position of the substrate 2 by means of marks on the substrate. The position information from the detection of the markers (alignment marks) is, in certain embodiments, sent to an imaging engine (a microprocessor which controls the individual elements of the programmable arrays 11) which then correct the control signals being sent to the arrays 11 for any shifts or errors in the X and/or Y positions of the substrate 2, for any rotations about the Z axis, for any magnification errors, for substrate distortions resulting from thermal expansions for example, and for any higher order effects.

Continuous substrate feed is achieved, at least in part, by control of drive rollers 41 in this example. The apparatus also includes a conditioning stage 9 positioned "up stream" of the patterning stage. An example of a conditioning stage is a tool used to establish a uniform temperature over a portion of the substrate 2 prior to patterning.

Thus, from the description of FIGS. 7 and 8, it will be appreciated that substrate processing apparatus embodying the invention can incorporate arrays of programmable masks (each comprising a respective array of controllable elements) 11 to image patterns on a substrate 2. A conditioning unit or units 9 can be used to precondition the substrate 2 (for example, to obtain a uniform temperature). A conditioning unit 9 can also be used as an air bearing for supporting and/or actuating the substrate 2 (i.e., for assisting, at least partially, in the conveying of the substrate 2 through the lithographic tool). An air bearing in the system provided to support the substrate 2 during the patterning process can also be used for conditioning. As the patterned beam is delivered to the substrate surface, overlay can be controlled by measuring marks at regular locations along the substrate 2. One or more rows of marks can be used. Course corrections for the position of the substrate 2 relative to the projection system can be corrected by adjusting the speed of the substrate 2 (i.e., the speed at which it is being conveyed from the supply, past the projection system). Finer corrections (for substrate position in X, Y, for rotations about the Z axis, for magnification, and for higher order effects) can be made either by moving the imaging array, by moving one or more components in the projection system, and/or by changing the image on the array at a particular time. Level and focus control can be achieved by continuously measuring the distance between the substrate 2 and a component of the projection optics (for example a micro lens array arranged to project the patterned beam onto the substrate 2 as an array of radiation spots). Corrections to the level and focus can be made by adjusting the micro lens array height and/or tilt, or another part of the optical system. Alternatively, the substrate target surface topography (for example deviations in its height and/or tilt from desired values) can be adjusted by control of an appropriately arranged supporting system (for example incorporating an air bearing table with one or more adjustable support members).

From a description of FIGS. 5 and 6 it will be appreciated that in certain embodiments of the invention, substrate feed can be controlled with mechanical contact, for example between rollers 41 and the substrate 2. To minimize contamination, actuators can be positioned after the imaging array and on the edge of the substrate 2. Alternatively, a contactless method can be used, for example by blowing air in the direction of movement. Again, overlay can be controlled by measuring marks on the substrate 2. One or more rows of marks can be used. Coarse corrections can be made by adjusting the speed of movement of the substrate 2. Fine corrections can be made by changing timing on the imaging array.

Referring now to FIG. 9, in this embodiment the substrate processing apparatus comprises a linear series of processing stages 7, 1, 8, 70, and 71. Stage 1 is a lithographic apparatus comprising an illumination system for supplying a projection beam of radiation, and a combined programmable beam patterning and projection system arranged to controllably pattern the beam and project a pattern onto a substrate surface, the projected pattern being arranged to extend across a substantial portion of a substrate's width. Although the detail is not shown in the figure, the patterning and projection system comprises a plurality of programmable masks, the patterned beam from each being directed on to a substrate surface via a respective MLA. The patterning and projection system is arranged to give accurate stitching between the "images" (i.e., the separate projected beams). The apparatus also comprises a substrate supply which contains a plurality of individual substrates 2, each having the same length to width ratio (approximately 5 in this example). The supply is arranged to output these substrates 2 (each of which represents an unbroken length) in a stream. A substrate conveying system 4 is arranged to convey the substrates 2 in a continuous, uninterrupted stream from the supply 3 and through the processing stages in series. In the figure, the conveying system is depicted highly schematically, as comprising rollers 43 and a conveyor belt 42. Other forms will be apparent to those skilled in the art. Stage 7 is a coater arranged to apply a resist layer to each substrate 2 in turn. The lithography stage then exposes the resist to a radiation pattern, and stage 8 develops the resist to produce a mask on the substrate surface. Stage 70 is a modification stage arranged to deposit a layer of device material over the masked surface. Stage 71 then strips off the remaining resist (and the "device" material that was deposited on it) to leave a pattern of device material on the substrate surface. Thus, the apparatus comprises a continuous feed of individual substrates 2, and adds a patterned device layer to each one in turn. Motion of each substrate 2 is linear and uninterrupted, as indicated by arrow A in the figure.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A lithographic apparatus comprising:
    an illumination system for supplying a projection beam of radiation;
    an array of individually controllable elements serving to impart the projection beam with a pattern in its cross-section to form a patterned beam;
    a projection system for projecting the patterned beam onto a target portion of a substrate;
    a substrate supply having adjacent layers of substrates arranged to output at least one unbroken length of substrate
    a substrate conveying system arranged to convey each outputted unbroken length of substrate from the substrate supply and past the projection system such that the projection system is able to project the patterned beam onto a series of target portions along each unbroken length of substrate; and
    a detection system arranged to detect alignment marks on the substrate that enable the lithographic apparatus to position the substrate.

2. The lithographic apparatus of claim 1, wherein the substrate conveying system is arranged to convey each outputted unbroken length of substrate in an uninterrupted manner from the substrate supply and past the projection system.

3. The lithographic apparatus of claim 1, further comprising a separating system for separating a layer of separating material from the outputted substrate before the outputted substrate is conveyed past the projection system.

4. The lithographic apparatus of claim 1, wherein the substrate supply comprises a reel, the at least one unbroken length of substrate is wound onto the reel, and the substrate supply is arranged to output each unbroken length from the reel.

5. The lithographic apparatus of claim 4, wherein the substrate is a glass substrate.

6. The lithographic apparatus of claim 1, wherein each unbroken length of substrate has a length to width ratio of at least one.

7. The lithographic apparatus of claim 1, wherein each unbroken length of substrate has a substantially uniform width and a length at least five times as large as the width.

8. The lithographic apparatus of claim 1, wherein the substrate supply is arranged to output a plurality of individual unbroken lengths of substrate.

9. The lithographic apparatus of claim 8, wherein the substrate conveying system is arranged to convey the plurality of individual unbroken lengths of substrate from the substrate supply and past the projection system in a series.

10. The lithographic apparatus of claim 9, wherein the series is a continuous series.

11. A device manufactured using apparatus in accordance with claim 1.

12. The device of claim 11, wherein the device is a flat panel display.

13. The lithographic apparatus of claim 1, further comprising a controller coupled to the detection system and the substrate conveying system, wherein control signals from the controller are used to control the movement of the substrate based on control signals from the detection system.

14. The lithographic apparatus of claim 13, wherein the controller is coupled to the array of individually controllable elements, wherein control signals from the controller are used to adjust the timing of control data sent to the controllable elements, thereby the radiation pattern being projected onto the substrate at a particular time is appropriate to the position of the substrate.

15. The lithographic apparatus of claim 1, wherein the detection system is arranged to detect alignment marks that enable the lithographic apparatus to determine a displacement of the substrate in a direction in which the substrate conveying system is arranged to convey each outputted unbroken length of substrate.

16. The lithographic apparatus of claim 15, wherein the detection system is arranged to detect alignment marks that enable the detection system to determine a displacement of the substrate in a direction perpendicular to the direction in which the substrate conveying system is arranged to convey each outputted unbroken length of substrate.

17. The lithographic apparatus of claim 1, wherein the detection system comprises:
    a moveable detector that is moveable in a direction perpendicular to the direction in which the substrate conveying system is arranged to convey each outputted unbroken length of substrate.

18. A device manufacturing method comprising the steps of:
    providing a substrate supply having adjacent layers of substrate with a separating material arranged between adjacent layers of substrate;
    outputting from the supply at least one unbroken length of substrate;
    providing a projection beam of radiation using an illumination system;
    using an array of individually controllable elements to impart the projection beam with a pattern in its cross-section to form a patterned beam;
    using a projection system to project the patterned beam;
    conveying each outputted unbroken length of substrate from the substrate supply and past the projection system;

positioning the length of substrate by detecting alignment marks extending along each unbroken length of substrate; and projecting the patterned beam onto a series of target portions along each unbroken length of substrate.

19. The method of claim 18, wherein the step of providing a substrate supply comprises providing each unbroken length of substrate on a roll.

20. The method of claim 19, wherein the substrate is glass.

21. The method of claim 18, further comprising the step of collecting each unbroken length of substrate on a roll after exposure to the patterned beam.

22. The method of claim 18, further comprising the steps of:

processing each unbroken length of substrate in at least one additional processing stage; and conveying each outputted unbroken length of substrate from the substrate supply, through the at least one additional processing stage, and past the projection system.

23. A device manufactured using a method in accordance with claim 18.

24. The device of claim 23, wherein the device is a flat panel display.

25. The method of claim 18, further comprising:

determining a displacement of the substrate in a direction in which the substrate conveying system is arranged to convey each outputted unbroken length of substrate by detecting the alignment marks extending along each unbroken length of substrate.

26. The method of claim 25, further comprising:

determining a displacement of the substrate in a direction perpendicular to the direction in which the substrate conveying system is arranged to convey each outputted unbroken length of substrate by detecting the alignment marks extending along each unbroken length of substrate.

27. A substrate processing apparatus comprising:

a lithographic apparatus that projects a patterned beam onto a target portion of a substrate;

a substrate supply having adjacent layers of substrates arranged to output at least one unbroken length of substrate, wherein a layer of separating material exists between adjacent layers of substrates; and a substrate conveying system arranged to convey each outputted unbroken length of substrate from the substrate supply such that the lithographic apparatus is able to project the patterned beam onto a series of target portions along each unbroken length of substrate; and a detection system arranged to detect alignment marks on the substrate that enable the lithographic apparatus to position the substrate.

28. The lithographic apparatus of claim 27, wherein the detection system is arranged to detect alignment marks that enable the lithographic apparatus to determine a displacement of the substrate in a direction in which the substrate conveying system is arranged to convey each outputted unbroken length of substrate.

29. The lithographic apparatus of claim 28, wherein the detection system is arranged to detect alignment marks that enable the detection system to determine a displacement of the substrate in a direction perpendicular to the direction in which the substrate conveying system is arranged to convey each outputted unbroken length of substrate.

30. The lithographic apparatus of claim 27, wherein the detection system comprises:

a moveable detector that is moveable in a direction perpendicular to the direction in which the substrate conveying system is arranged to convey each outputted unbroken length of substrate arranged to detect the alignment marks.

31. A device manufacturing method comprising the steps of:

providing a substrate supply having adjacent layers of substrate with a separating material arranged between adjacent layers of substrate;

outputting from the supply at least one unbroken length of substrate;

providing a projection beam of radiation using a lithographic apparatus;

conveying each outputted unbroken length of substrate from the substrate supply;

positioning the length of substrate by detecting alignment marks extending along each unbroken length of substrate; and projecting the patterned beam onto a series of target portions along each unbroken length of substrate.

32. The method of claim 31, further comprising:

determining a displacement of the substrate in a direction in which the substrate conveying system is arranged to convey each outputted unbroken length of substrate by detecting the alignment marks extending along each unbroken length of substrate.

33. The method of claim 32, further comprising:

determining a displacement of the substrate in a direction perpendicular to the direction in which the substrate conveying system is arranged to convey each outputted unbroken length of substrate by detecting the alignment marks extending along each unbroken length of substrate.

* * * * *